United States Patent
Ordentlich et al.

(10) Patent No.: US 9,998,149 B2
(45) Date of Patent: Jun. 12, 2018

(54) CONSTANT HAMMING WEIGHT CODING

(71) Applicant: Hewlett Packard Enterprise Development LP, Houston, TX (US)

(72) Inventors: Erik Ordentlich, San Jose, CA (US); Ron M. Roth, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 10 days.

(21) Appl. No.: 15/113,903

(22) PCT Filed: Jan. 31, 2014

(86) PCT No.: PCT/US2014/014219
§ 371 (c)(1),
(2) Date: Jul. 25, 2016

(87) PCT Pub. No.: WO2015/116184
PCT Pub. Date: Aug. 6, 2015

(65) Prior Publication Data
US 2016/0352359 A1     Dec. 1, 2016

(51) Int. Cl.
*H03M 13/00* (2006.01)
*H03M 13/15* (2006.01)
*H03M 13/51* (2006.01)

(52) U.S. Cl.
CPC ..... *H03M 13/1575* (2013.01); *H03M 13/155* (2013.01); *H03M 13/51* (2013.01)

(58) Field of Classification Search
CPC ............ H03M 13/51; H03M 13/155; H03M 13/1575; H03M 13/03; H03M 13/033; H03M 13/1505; H03M 13/6356; H03M 13/6362; H03M 13/6516; H03M 13/6525; H04L 25/49; H04L 1/0041; H04L 25/03866; H04L 25/4902; H04L 1/0057
See application file for complete search history.

(56) References Cited

U.S. PATENT DOCUMENTS

| | | | |
|---|---|---|---|
| 6,460,159 B1 | 10/2002 | Kim et al. | |
| 7,791,511 B1 | 9/2010 | Skoane et al. | |
| 7,881,089 B2 | 2/2011 | Franceschini et al. | |
| 8,537,919 B2 | 9/2013 | Fonseka et al. | |

(Continued)

FOREIGN PATENT DOCUMENTS

KR     102005010762 A     11/2005

OTHER PUBLICATIONS

Gad, E.E., et al., Rank-modulation Rewrite Coding for Flash Memories, Dec. 3, 2013, IEEE International Symp. On Information Theory (ISIT), 25 pages.

(Continued)

*Primary Examiner* — Guerrier Merant
(74) *Attorney, Agent, or Firm* — Patent Law Offices of David Millers

(57) ABSTRACT

Encoding or decoding can operate a processing system to apply one or more recursive relations to a known parameter associated with a length m and a Hamming weight 1 to produce a computed parameter associated with length m−1. An encoding process can thus assign values to bits of a code based on comparison of the data value being encoded and the computed parameter. A decoding process can use the computed parameters in a calculation of a decoded data value.

18 Claims, 4 Drawing Sheets

(56) References Cited

U.S. PATENT DOCUMENTS

| | | |
|---|---|---|
| 2002/0118126 A1 | 8/2002 | Corneslius et al. |
| 2007/0053378 A1 | 3/2007 | Kuekes et al. |
| 2009/0217139 A1* | 8/2009 | Roh .................. H03M 13/03 714/783 |
| 2010/0281340 A1 | 11/2010 | Franceschini et al. |
| 2012/0096234 A1 | 4/2012 | Jiang et al. |
| 2013/0064272 A1* | 3/2013 | Piechocki ............ H04L 25/49 375/219 |

OTHER PUBLICATIONS

PCT International Search Report & Written Opinion, dated Oct. 23, 2014, PCT Patent Application No. PCT/US2014/014219, 11 pages.

Schouhamer Immink, K.A., A Practical Method for Approaching the Channel Capacity of Constrained Channels, 1997, IEEE Transactions on information Theory, 43, pp. 1389-1399.

Tal, I., et al., On Row-by-row Coding for 2-D Constraints, 2009, IEEE Transactions Information Theory, vol. 55, No. 8, Aug. 2009, pp. 3565-3576.

Talyansky, R., et al., Efficient Code Construction for Certain Two-Dimensional Constraints, 1999, IEEE Transactions on Information Theory, 45(2), pp. 794-799.

* cited by examiner

CONSTANT HAMMING WEIGHT CODING

BACKGROUND

The Hamming weight of a string or word is the number of symbols in the string or word that differ from the zero-symbol of the alphabet that is used to express the string or word, and particularly, the Hamming weight of a binary word is the number of ones in the binary word. Constant Hamming weight coding is a type of encoding that encodes input data into codewords that all have the same Hamming weight. Constant Hamming weight coding has many uses particularly in error detection and correction strategies, where an error in a constant Hamming weight binary codeword can be easily detected if the codeword does not contain the correct number of ones. Hamming weight coding has also been used in data storage such as in memory systems including cross-point arrays of memristor memory elements, where encoding of raw binary data produces codewords that when stored in the cross-point memory array may limit the numbers of low resistance states in rows or columns of the array. Encoded storage using constant Hamming weight codes may thus avoid data-dependent memory performance issues that may arise if rows or columns of a memory array are allowed to contain a large number of memory elements in a low resistance state.

BRIEF DESCRIPTION OF THE DRAWINGS

Use of the same reference symbols in different figures indicates similar or identical items.

DETAILED DESCRIPTION

Constant Hamming weight encoding or decoding for codewords of any size may be implemented using a single input parameter $\hat{N}(n,k)$ associated with a codeword length n and a Hamming weight k, recursive relations for determination of values of a function $\hat{N}(m,l)$, and modest floating point processing capabilities to evaluate the recursive relations. The following describes examples of encoding of binary data to produce binary codewords and examples of decoding binary codewords to recover binary data, although the techniques disclosed may be extended or modified for data or codes using other representations. Also, in the following examples, binary values 0 and 1 may be interpreted as placeholders for two arbitrary distinct values, in which case the Hamming weight refers to the occurrence count of one of these values that would be substituted wherever "1" occurs. One specific example is a case in which the roles of 0 and 1 are reversed.

For binary coding, a set A(n,k) of words containing exactly n bits and having a Hamming weight k can be defined as shown in Equation 1.

$$A(n,k) = \{z^n \in \{0,1\}^n : \Sigma_{i=1}^n z_i = k\}$$  Equation 1:

An encoding system that aims at encoding data units of a specific length, e.g., a specific number of bits, needs to use encoding parameters n and k such that a number N(n,k) of words available in the set A(n,k) is greater than or equal to the number of different input data values that may need to be encoded. For example, encoding p-bit binary data values requires a set A(n,k) containing at least $2^p$ words. In general, an encoding process may not use all of the words in the set A(n,k) for encoding of data. Even so, for reasonably sized input data values, the codewords that are used for encoding data values may be so numerous that storing a look-up table that maps data values to codewords is impractical in many physical systems. Accordingly, encoding and decoding processes may perform computations to avoid the need for large look-up tables. Further, the encoding and decoding process may employ storage and processing hardware having specific capability and accuracy, and a practical encoding and decoding process should be executable in such hardware without concern that round-off or other errors, which may be inherent in the available hardware, may create coding or decoding errors.

Figure 1:
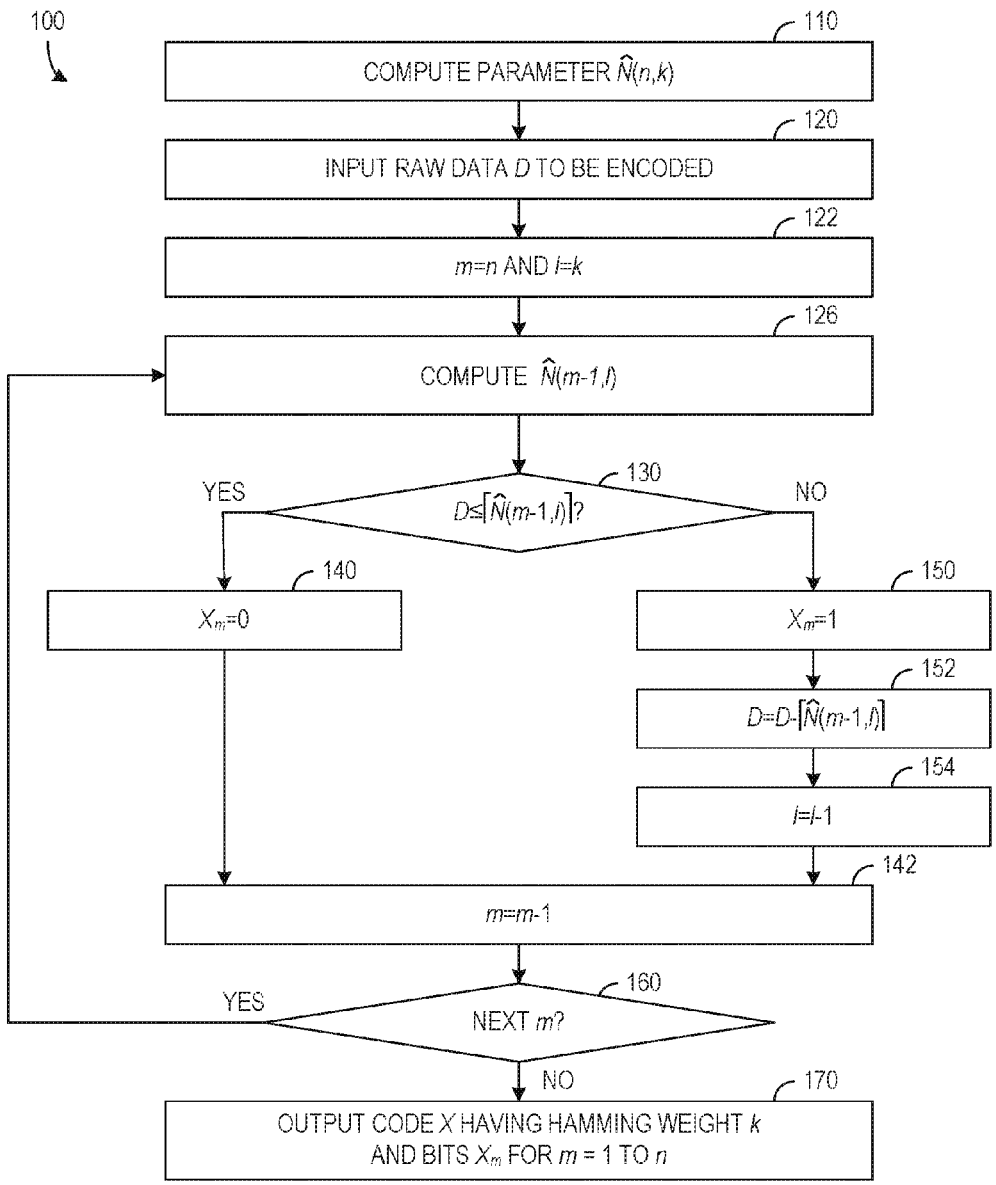
FIG. 1 is a flow diagram of an example of one implementation of a process for encoding raw data into a constant Hamming weight codeword.

FIG. 1 is a flow diagram illustrating one implementation of an encoding process 100 that encodes a data value D to produce a binary codeword X of length n and Hamming weight k. Accordingly, process 100 produces a binary codeword X that is an element of the set A(n,k) defined in Equation 1.

Encoding process 100 uses a single input parameter $\hat{N}(n,k)$, rather than a lookup table. Parameter $\hat{N}(n,k)$ is considered herein to be the value of a function $\hat{N}(m,l)$ when m=n and l=k. Further, the function $\hat{N}(m,l)$ may in some sense approximate the function N(m,l), which gives the total number words in the set A(m,l), i.e., the total number of binary words having length m and Hamming weight l, but function $\hat{N}(m,l)$ is required to be less than or equal to function N(m,l) for all relevant values of m and l as indicated in Equation 2.

$$\hat{N}(m,l) \leq N(m,l)$$  Equation 2:

A sufficiently powerful computing system could calculate the values of function N(m,l), e.g., using the formula m!/(m−l)!l!, and function N(m,l) could be used for function $\hat{N}(m,l)$. But, exact computation of a value N(m,l) generally requires calculations of large factorials, making exact calculations impractical in many computing systems or impractical for use in desired encoding times. Further, data units normally used in hardware executing process 100 may not be large enough to represent an exact value for function N(m,l). For one specific case given length n and given Hamming weight k, the approximation $\hat{N}(n,k)$ may be as close to (but smaller than) the exact value N(n,k) as can be conveniently stored or manipulated in the hardware executing process 100. Whether approximation $\hat{N}(n,k)$ and exact value N(n,k) are equal or not, process block 110 can compute $\hat{N}(n,k)$, e.g., using a high-power processing system during design of an encoding or decoding system for implementing process 100, and the pre-computed parameter $\hat{N}(n,$ k) determined in process block 110 can be stored in encoding hardware for later use when encoding process 100 receives and encodes data values.

A process block 120 receives a data value D to be encoded. Data value D may be, for example, an integer greater than or equal to 1 and less than or equal to $\hat{N}(n,k)$ and may be further limited to a value within a range from 1 to $2^p$, where $2^p$ is less than or equal to parameter $\hat{N}(n,k)$ and therefore less than or equal to the total number N(n,k) of codes in code set A(n,k). In this manner, D may be represented as 1 added to a p-bit binary number. For encoding of data value D, a process block 122 can set process variables m and l to initially equal the number n of bits in the codeword X being generated and the Hamming weight k of the codeword X being generated. As described further below, process 100 uses n iterations that generate codeword X one bit at a time. A process block 126 computes $\hat{N}(m-1,l)$ using a known value or values $\hat{N}(m,l)$ and recursive relations. (See the example of Equations 7, 8, and 9, below.) Initially, m=n and l=k, so that $\hat{N}(m,l)$ is equal to the pre-computed parameter value $\hat{N}(n,k)$. The computed value $\hat{N}(m-1,l)$ may be an estimate of the number of codewords of length m−1 and Hamming weight l used as the m−1 least significant or lower indexed bits of a codeword X having a most significant or leftmost bit $X_m$ equal to zero, wherein the bits in codeword X from left (most significant) to right (least significant) are indexed m to 1, as in $X=X_m, X_{n-1}, \ldots, X_2, X_1$.

Process 100 in the implementation shown in FIG. 1 assigns data values D to codes X in order of sizes, so that if a data value D1 is greater than a data value D2, the codeword X1 corresponding to data value D1 is greater than the code X2 corresponding to data value D2, where the comparison is based on interpreting the codewords as the binary representations of integers, with the leftmost bit (with index n) being the most significant bit and the rightmost bit (index 1) being the least significant (Other possible assignments of data relations to codes are possible and may require modifications to the illustrated implementation of process 100.) In general, a binary word of length m and Hamming weight l can be thought of as a most significant bit and a sub-word of length m−1. If the most significant bit is zero, the sub-word of length m−1 has all of the ones of the word and therefore has Hamming weight l. A decision block 130 determines whether data value D is less than or equal to the smallest integer greater than computed value $\hat{N}(m-1,l)$, i.e., whether $D \leq \lceil \hat{N}(m-1,l) \rceil$. As noted above, computed integer value $\lceil \hat{N}(m-1,l) \rceil$ may indicate the number of different possible m−1 least significant bits that may be used in a word X having bit m equal to zero. If data value D is less than or equal to computed value $\lceil \hat{N}(m-1,l) \rceil$, the data value D is encoded with a codeword X having bit m equal to zero concatenated with a word of length m−1 and Hamming weight l, and a process block 140 selects zero for the value of a bit $X_m$ of codeword X. Process 100 then needs to determine a word of length m−1 corresponding to the data value D, and a process block 142 decrements length variable m.

If decision block 130 determines that data value D is greater than the last computed integer value $\lceil \hat{N}(m-1,l) \rceil$, the remaining portion of the codeword X is larger than any of the m-bit codewords with zero as the most significant bit, and a process block 150 selects 1 for the value of bit $X_m$ of codeword X. Process 100 then needs to determine a word of length m−1 and Hamming weight l−1 that distinguishes data values having codewords X with one or more most significant bits as already set. A block 152 decreases data value D by computed integer value $\lceil \hat{N}(m-1,l) \rceil$. A process block 154 decrements Hamming weight variable l, and process block 142 decreases code length variable m.

After process block 142, a decision block 160 ends an iteration that selected whether bit $X_m$ was 0 or 1 and determines whether any further codeword bits need to be selected. In the implementation of FIG. 1, all of the bits $X_n \ldots X_1$ of codeword X have been selected and can be output in a process block 170 if length variable m is equal to 0 in block 160. Otherwise, further bits of codeword X need to be determined, and process 100 branches from decision block 160 to process block 126 and computes $\hat{N}(m-1,l)$ for values of length variable m and Hamming weight variable l, which were modified in at least one of blocks 142 and 154.

An implementation of process 100 using particular hardware needs to provide a technique for calculation of $\hat{N}(m-1,l)$ in process block 126. As noted above, the number N(m,l) of words in set A(m,l) may be difficult or impractical to exactly calculate, store, or use for values of function $\hat{N}(m,l)$. Instead, a function $\hat{N}(m,l)$ may be sought that satisfies Equation 2 (above) and Equation 3 (below) and that is easily computed using available hardware. Equation 2 ensures that function $\hat{N}(m,l)$, which indicates a number of words of length m and Hamming weight l that may be used within codewords, is less than or equal to the number of all words of length m and Hamming weight l. Equation 3 ensures that when a most significant bit of an m-bit code is selected, as in process block 140 and 150 of encoding process 100, the words of length m−1 and Hamming weight l or l−1 that may be used in a sub-word are sufficient to distinguish distinct data values.

$$\hat{N}(m,l) \leq \hat{N}(m-1,l) + \hat{N}(m-1,l-1) \quad \text{Equation 3:}$$

In one specific implementation, function $\hat{N}(m,l)$ is further required to provide values within a set F(b) given in Equation 4. In Equation 4, a "precision" b is a positive integer, and $\mathbb{Z}^+$ represents the set of positive integers. Elements or values $M \cdot 2^{e-b}$ in set F(b) can be interpreted as b-bit floating-point values, where M is a binary mantissa between one half (½) and strictly smaller than one (1) and e is an exponent base two. The requirement that function $\hat{N}(m,l)$ provide values within a set F(b) suggests that values of function $\hat{N}(m,l)$ can be stored or calculated using hardware that supports b-bit floating point arithmetic.

$$F(b) \triangleq \{0\} \cup \{M \cdot 2^{e-b} : e \in \mathbb{Z}^+, M \in \mathbb{Z}^+ \cap [2^{b-1}, 2^b - 1]\} \quad \text{Equation 4:}$$

Operations $\lceil x \rceil_b$ and $\lfloor x \rfloor_b$ on any real number x can be based on a set F(b) for a precision b and can be defined as shown in Equations 5 and 6. (If a real value x is less than zero, $\lceil x \rceil_b = \lfloor x \rfloor_b = 0$.) Operations $\lceil x \rceil_b$ and $\lfloor x \rfloor_b$ thus identify b-bit floating point values close to real value x. The values $\lceil x \rceil_b$ and $\lfloor x \rfloor_b$ are distinct from values $\lceil x \rceil$ and $\lfloor x \rfloor$. A value $\lceil x \rceil$ is the smallest integer greater than or equal to real value x, and a value $\lfloor x \rfloor$ is the largest integer less than or equal to real value x.

$$\lceil x \rceil_b = \min\{y \in F(b) : y \geq x\} \quad \text{Equation 5:}$$

$$\lfloor x \rfloor_b = \max\{y \in F(b) : y \leq x\} \quad \text{Equation 6:}$$

An encoding system capable of storing and manipulating b-bit floating-point numbers can use Equation 7 to compute parameter $\hat{N}(n,k)$ as in process block 110 of process 100, and parameter $\hat{N}(n,k)$ may be represented and stored using a floating-point value from set F(b). Recursive relationships defined for function $\hat{N}(m,l)$ as shown in Equations 8 and 9 can then be used to compute $\hat{N}(m-1,l)$ and $\hat{N}(m-1, l-1)$ when needed, e.g., in process block 126 of process 100. In particular, an initial execution of process block 126 can use parameter $\hat{N}(m,l)=\hat{N}(n,k)$ in Equation 8 to compute $\hat{N}(m-1,l)$. Subsequently, if the prior iteration set a bit to 0, only length variable m was decremented, and the previous execution of process block 126 provided a new value for $\hat{N}(m,l)$, which can again be used in Equation 8 to determine $\hat{N}(m-1,l)$. If a prior iteration set a bit to 1, length variable m and Hamming weight variable l were both decremented, and the previous value computed by process block 126 is used as $\hat{N}(m,l)$ in Equation 8 and the value from Equation 8 is used in Equation 9.

$$\hat{N}(n,k)=\lfloor N(n,k)(1+2^{-(b-1)})^{-(n-1)}\rfloor_b \qquad \text{Equation 7:}$$

$$\hat{N}(m-1,l)=\lceil (m-l)*\hat{N}(m,l)/m\rceil_b \qquad \text{Equation 8:}$$

$$\hat{N}(m-1,l-1)=[\hat{N}(m,l)-\hat{N}(m-1,l)], \qquad \text{Equation 9:}$$

Encoding process 100 using Equations 7, 8, and 9 to recursively define the required values of function $\hat{N}(m,l)$ can be mathematically proven to provide a function $\hat{N}(m,l)$ that satisfies Equations 2 and 3 and that allows encoding of data values D to unique codewords X containing n bits and having a Hamming weight k. Such proofs are, however, unnecessary for construction or use of implementations of encoding process 100 and therefore not described in detail here.

Figure 2:
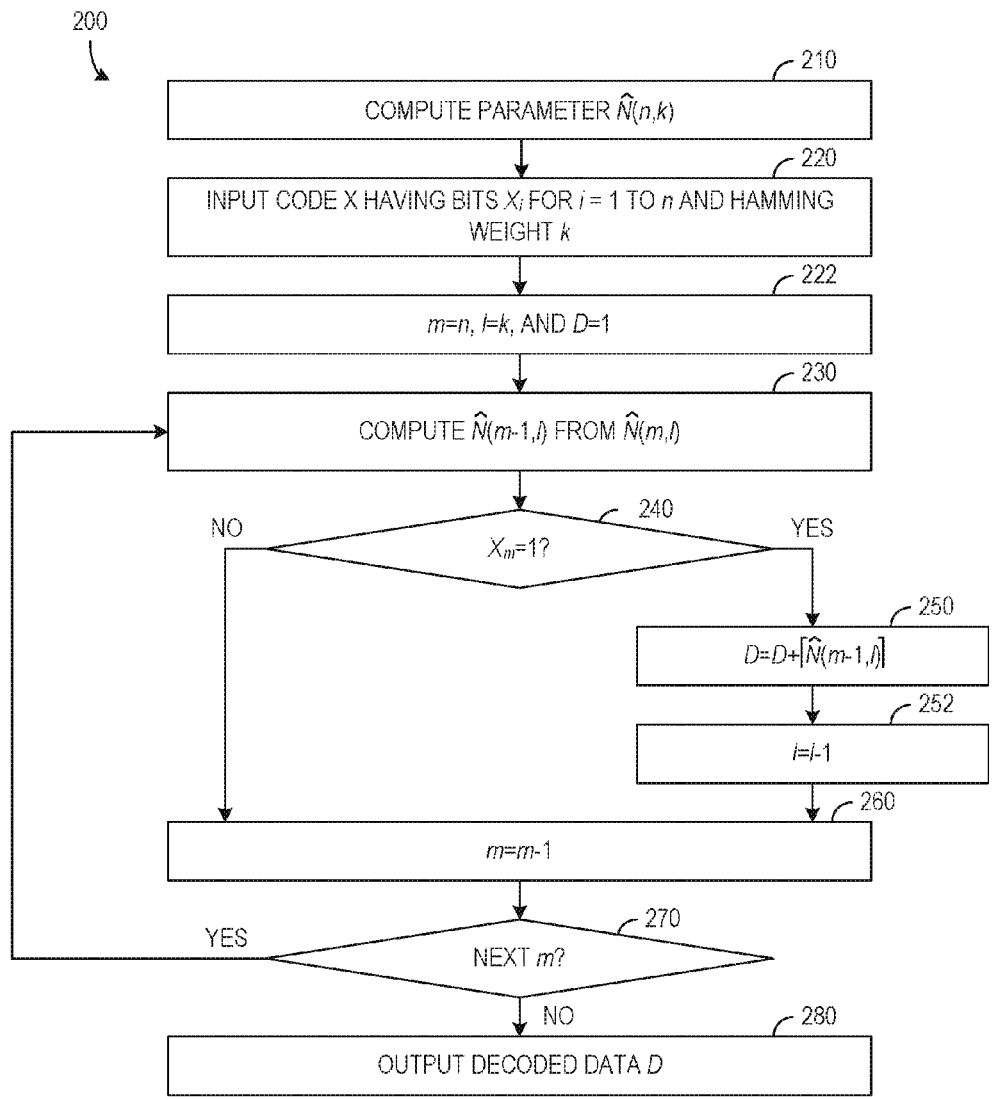
FIG. 2 is a flow diagram of an example of one implementation of a process for decoding a constant Hamming weight codeword to recover a data value.

FIG. 2 is flow diagram illustrating one implementation of a decoding process 200 that may be complementary to encoding process 100 of FIG. 1. Decoding process 200 can thus decode a binary codeword X of length n and Hamming weight k to reconstruct the data value D. Decoding process 200 uses a parameter $\hat{N}(n,k)$, which is the same parameter used in the encoding process and may be computed in the same manner as described above for encoding process 100. For example, Equation 7 above could be used to calculate parameter $\hat{N}(n,k)$, and the computation of parameter $\hat{N}(n,k)$ may be performed during design or construction of a decoding system implementing decoding process 200. Decoding process 200 in a process block 220 receives codeword X, which includes a string of bits $X_i$ for i from 1 to n and which has a Hamming weight k. Codeword X may be generated using encoding process 100 or any process that provides the same mapping from data D to codewords X that process 100 provides. For the input codeword X, a process block 212 initializes a length variable m equal to code length n, a Hamming weight variable l equal to the Hamming weight k, and a data value D to 1.

A process block 220 computes a value $\hat{N}(m-1,l)$ from a known value or known values of function $\hat{N}(m,l)$. Such computation may be based on the recursive relations defined by Equations 8 and 9 above, which may be implemented using hardware providing b-bit floating point arithmetic using values in set F(b) as in Equation 4 above. A decision block 240 determines whether a codeword bit $X_m$ for the current value of variable m is equal to 1. If so, the tentative decoded data value D is smaller than the original encoded data value by more than the calculated value $\hat{N}(m-1, l)$, and the next m-1 bits of codeword X has Hamming weight l-1. Accordingly, a process block 250 adds a calculated integer value $\lceil \hat{N}(m-1,l) \rceil$ to data value D, a process block 252 decrements Hamming weight variable l, and processing block 260 decrements length variable m. If decision block 240 determines that code bit $X_m$ is zero, the data value D is not increased and Hamming weight variable l is not changed, but process block 260 decrements length variable m for a next iteration.

Decision block 270 determines whether further iteration is needed, i.e., whether more bits of the codeword remain to be processed. If so, process 200 returns to process block 230, where $\hat{N}(m-1, l)$ is computed for current values of variables m and l as modified in process block 252 or 260. Iterations continue until all of the bits of code X have been evaluated, e.g., when decision block 270 determines that m is equal to 0. At which point, data D has the decoded value, which a process block 280 outputs as data D.

Decoding process 200 using Equations 7, 8, and 9 to recursively define the function $\hat{N}(m,l)$ can be mathematically proven to decode each codeword X containing n bits and having a Hamming weigh k to produce the original data that process 100 using the same recursive relations encoded as codeword X. Such proofs are, however, unnecessary for construction or use of implementations of encoding process 200 and therefore not described in detail here.

Figure 3A:
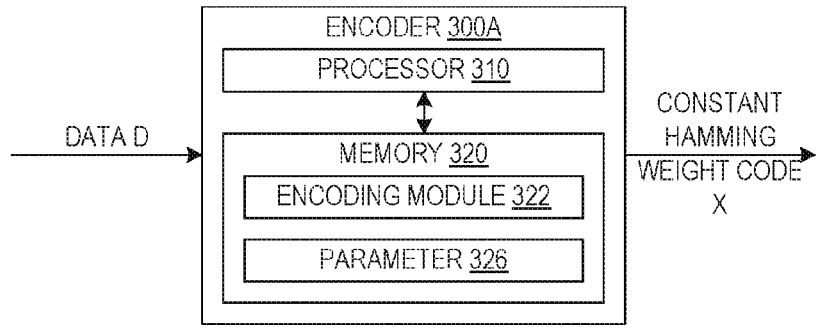
FIG. 3A is a block diagram illustrating an example of one implementation of an encoder.

Encoding and decoding processes such as described illustrated in FIGS. 1 and 2 can be implemented in a variety of hardware devices. FIG. 3A, for example, is a block diagram of an encoder 300A. Encoder 300A, which may be part of a larger system, receives data values D and outputs respective constant Hamming weight codewords X, which may be transmitted to or stored in another system (not shown). In the illustrated implementation, encoder 300A includes a processor 310 and memory 320 that stores a software portion of an encoding module 322. All or portions of encoding module 322 may alternatively be implemented in dedicated hardware that performs the encoding functions described herein. Encoding module 322 in operation, e.g., when executed by processor 310, may particularly employ an enumerative encoding process using recursive relations to determine values of a function $\hat{N}(m,l)$ that may indicate counts of the words of length m and Hamming weight l that may be used for portions of a codeword X. Further, encoding module 322 does not require a lookup table of codewords or a lookup table representing function $\hat{N}(m,l)$, but instead can compute values of function $\hat{N}(m,l)$ using a parameter 326, the recursive relations, and floating point arithmetic. In example implementations, operation of encoding module 322 performs process 100 of FIG. 1 or process 400 of FIG. 4.

Figure 3B:
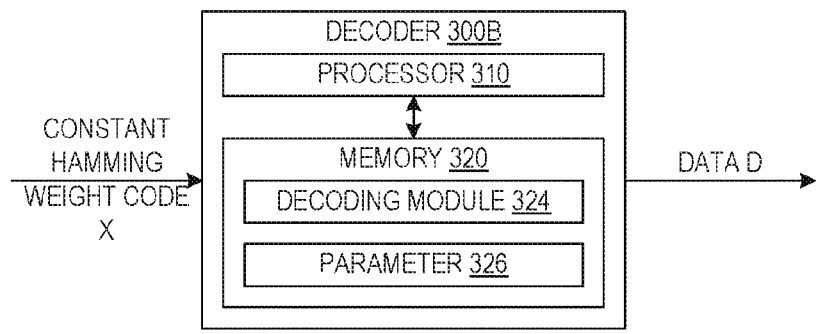
FIG. 3B is a block diagram illustrating an example of one implementation of a decoder.

FIG. 3B is a block diagram of a decoder 300B that receives constant Hamming weight codewords X and outputs respective data values D. In the illustrated implementation, decoder 300B includes a processor 310 and memory 320 that stores a software portion of a decoding module 324. All or portions of decoding module 324 may alternatively be implemented in dedicated hardware that performs the decoding functions described herein. Decoding module 324 in operation, e.g., when executed by processor 310, may particularly employ a decoding process using the function $\hat{N}(m,l)$ to determine counts of the words of length m and Hamming weight l that may be used for portions of a codeword X. Further, decoding module 324 does not require a lookup table mapping codewords to data or a lookup table representing function $\hat{N}(m,l)$, but can instead compute values of function $\hat{N}(m,l)$ using parameter 326, recursive relations, and floating point arithmetic. In example implementations, operation of decoding module 324 performs process 200 of FIG. 2 or process 500 of FIG. 5.

Figure 3C:
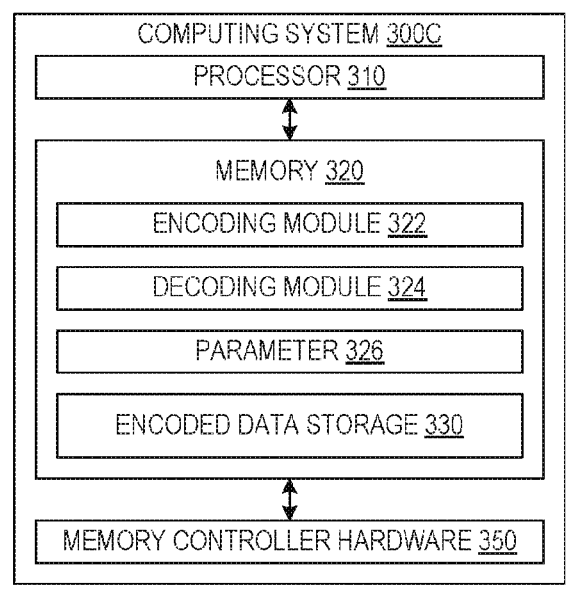
FIG. 3C is a block diagram illustrating an example of one implementation of a computing system that employs constant Hamming weight encoding and decoding.

FIG. 3C illustrates an implementation of a computing system 300C that uses encoding and decoding modules 322 and 324. Computing system 300C may be any type of computing device including, but not limited to, a server, a desktop computer, a laptop computer, a pad computer, a Personal Digital Assistant (PDA), or a smart phone. In some implementations, computing system 300C may be a piece of hardware designed specifically for encoding and decoding bits. In the illustrated implementation, physical computing system 300C includes a processor 310 and memory 320 storing software portions of encoding module 322 and decoding module 324 and storing parameter 326, which encoding module 322 and decoding module 324 may use as described above. Memory 320 further includes encoded data storage 330 with associated memory controller hardware 330. In some implementations, some or all of encoding and decoding modules 322 and 324 may be implemented in memory controller hardware 350. Encoded data storage 330 may, for example, be a cross-point array or other memory system that encodes stored data to provide consistent memory performance. In such cases, memory controller 350 may use encoding module 322 during write operations to encode data and produce encoded blocks having a fixed number of ones or zeros in each row or each column of the encoded block. Memory controller 350 can similarly use decoding module 324 during read operations to decode blocks from which target data may be read.

Some encoded data storage systems are further described, for example, in U.S. Pat. App. Pub. No. 2013/0097396, entitled "Method and System for Encoding Data for Storage in a Memory Array" and U.S. Pat. App. Pub. No. 2013/0121062, entitled "Rewriting a Memory Array," which are incorporated by reference herein to the extent legally permitted.

Figure 4:
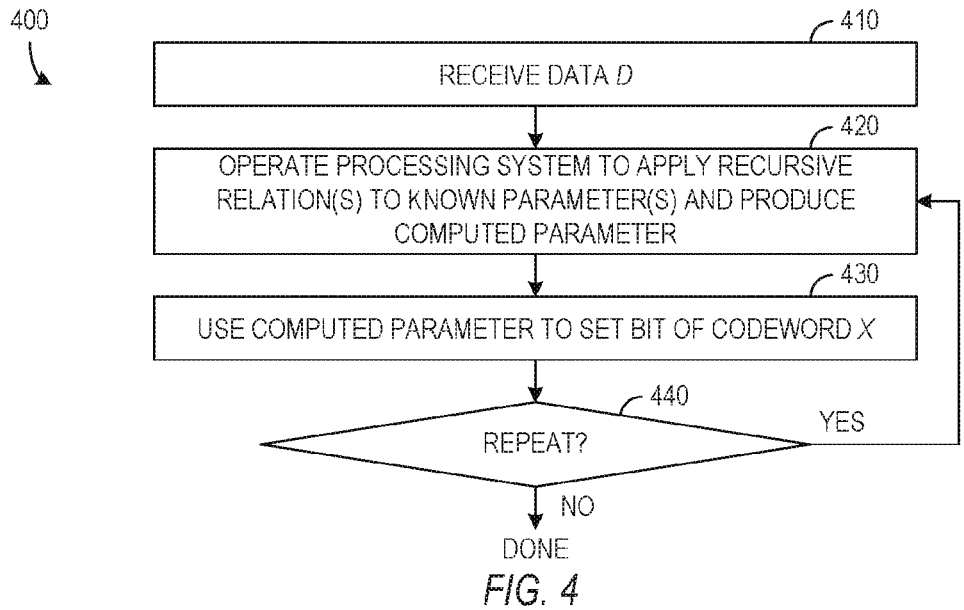
FIG. 4 is a flow diagram of another example of a process for encoding raw data into a constant Hamming weight codeword.

FIG. 4 shows an example of a general encoding process 400 using recursively computed parameters in encoding of data D as a constant Hamming weight codeword X having a length n and a Hamming weight k. Process 400 receives data D in a process block 410. A process block 420 uses one or more known parameters and recursive relations to compute a parameter. The known parameter or parameters may be a parameter that was computed or stored before receipt of the data value D or a parameter that was computed in an earlier repetition of block 420. Process block 420 may employ hardware that represents the known parameter or other quantities using a precision that is insufficient for exact representation of a total number N(n,k) of n-bit codewords having the Hamming weight k. The computed parameter corresponds to a bit of codeword X, and a block 430 sets the corresponding bit of the codeword X using the computed parameter, e.g., according to a comparison of the computed parameter and a value determined from data D. A decision block 440 then determines whether to set another bit. If so, process 400 branches back to step 420 and computes another parameter. If not, process 400 is done.

Figure 5:
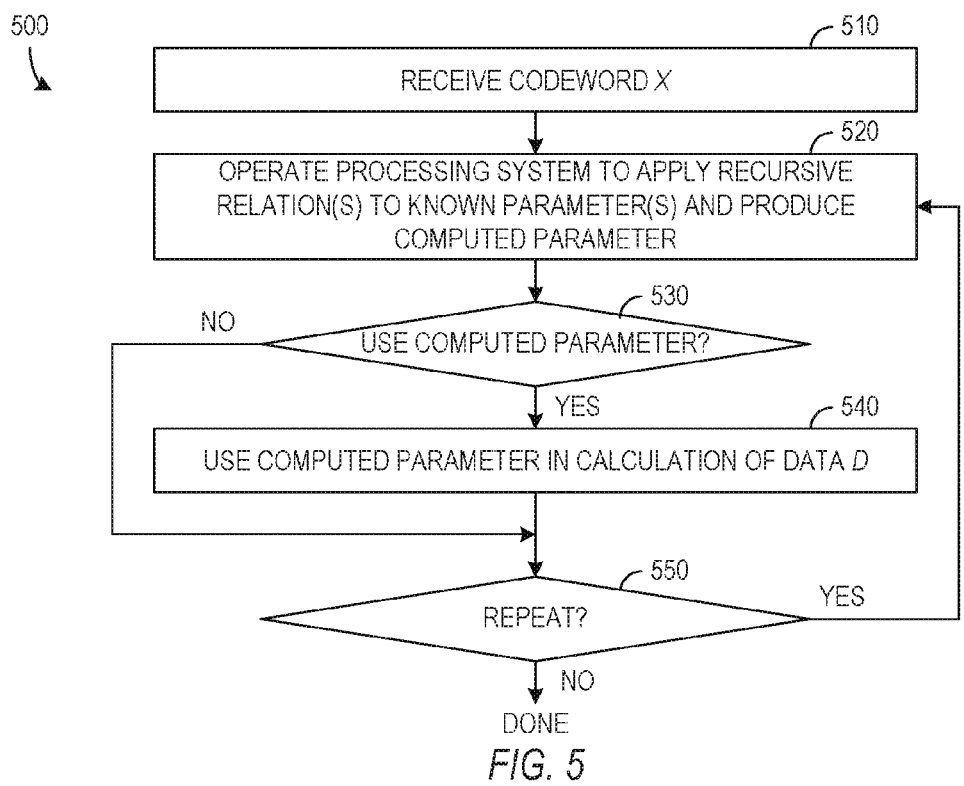
FIG. 5 is a flow diagram of another example of a process for decoding a constant Hamming weight codeword to recover a data value.

FIG. 5 shows an example of a general decoding process 500 using recursively computed parameters in decoding of a constant Hamming weight codeword X having a length n and a Hamming weight k to produce data D. Process 500 receives codeword X in a process block 510. A process block 520 uses one or more known parameters and recursive relations to compute a parameter. The known parameter or parameters may be a parameter that was computed or stored before receipt of the codeword X or a parameter that was computed in an earlier repetition of block 520. Process block 520 may employ hardware that represents the known parameter or other quantities using a precision that is insufficient for exact representation of a total number N(n,k) of n-bit codewords having the Hamming weight k. The computed parameter corresponds to a bit of codeword X, and a block 530 determines whether to use the computed parameter in the calculation of data D. For example, a block 540 may use the computed parameter in a calculation of data D if the computed parameter corresponds to a bit of the codeword X having a specific value, e.g., value 1. Whether or not the computed parameter is used, a decision block 550 determines whether another bit of the codeword X needs to be process. If so, process 500 branches back to step 520 and computes another parameter. If not, process 500 is done.

All or portions of some of the above-described systems and methods can be implemented in a computer-readable media, e.g., a non-transient media, such as an optical or magnetic disk, a memory card, or other solid state storage containing instructions that a computing device can execute to perform specific processes that are described herein. Such media may further be or may be contained in a server or other device connected to a network such as the Internet that provides for the downloading of data and executable instructions.

Although the invention has been described with reference to particular implementations, the disclosed implementations are only examples and should not be taken as limitations. Various other adaptations and combinations of features of the implementations disclosed are within the scope defined by the following claims.

What is claimed is:

1. A process comprising:
   (a.) receiving a data value to be encoded as a constant Hamming weight codeword having a length n and a Hamming weight k;
   (b.) operating a processing system to apply one or more recursive relations to a known parameter associated with a length m and a Hamming weight l to produce a computed parameter associated with length m−1, wherein the processing system represents the known parameter using a precision that is insufficient for exact representation of a total number N(n,k) of n-bit codewords having the Hamming weight k;
   (c.) assigning a value to a bit of the codeword based on a comparison of the computed parameter and a value determined from data value D;
   (d.) reducing the length m and setting the known parameter equal to the computed parameter;
   (e.) repeating (b.), (c.), and (d.) until all bits of the codeword have been assigned values; and
   (f.) storing the constant Hamming weight codeword-encoded data value within a cross-point array of a memory device, the data value being encoded as the constant Hamming weight codeword causing storage of a fixed number of ones or zeros in rows or columns of an encoded memory block including the data value.

2. The process of claim 1, wherein the one or more recursive relationships define a function $\hat{N}$ such that:

$$\hat{N}(m,l) \leq N(m,l); \text{ and}$$

$$\hat{N}(m,l) \leq \hat{N}(m-1,l) + \hat{N}(m-1,l-1), \text{ where;}$$

$\hat{N}(m,l)$, $\hat{N}(m-1,l)$, and $\hat{N}(m-1,l-1)$ are values of the function $\hat{N}$ respectively associated with the length m and the Hamming weight l, the length m−1 and the Hamming weight l, and the length m−1 and a Hamming weight l−1; and N(m,l) is a total number of m-bit codewords having the Hamming weight l.

3. The process of claim 1, wherein operating the processing system comprises performing floating-point computation according to the recursive relations.

4. The process of claim 3, wherein the one or more recursive relations are $$\hat{N}(m-1,l)=\lfloor (m-l)*\hat{N}(m,l)/m \rfloor_b; \text{ and}$$

$$\hat{N}(m-1,l-1)=\lfloor \hat{N}(m,l)-\hat{N}(m-1,l) \rfloor, \text{ where}$$

$\hat{N}(m,l)$ indicates the known parameter and notation $\lfloor x \rfloor_b$ denotes a greatest floating value of precision b that is less than or equal to x.

5. The process of claim 4, wherein:
for an initial execution of (b.), the known parameter has an initial value that was stored before receipt of the data value; and
for repetitions of (b.), the known parameter has a value that was computed after receipt of the data value.

6. The process of claim 5, wherein the initial value $\hat{N}(n,k)$ is representable using the floating point representation of the processing system and satisfies $$\hat{N}(n,k)=N(n,k)(1+2^{-(b-1)})^{-(n-1)}, \text{ where}$$

n is the length of the code;
k is the Hamming weight of the code;
N(n,k) is a total number of n-bit codes having the Hamming weight k; and
b is a precision of a floating-point representation that the processing system uses when applying the one or more recursive relations.

7. The process of claim 1, wherein: when (c.) assigns a value 1 to a bit of the code, the computed parameter produced in a next repetition of (b.) is associated with a Hamming weight l−1; and when (c.) assigns a value 0 to a bit of the code, the computed parameter produced in the next repetition of (b.) is associated with the Hamming weight l.

8. A device comprising:
memory storing a parameter corresponding to a length value n and a Hamming weight value k; and
an encoding module to apply one or more recursive relations to a known parameter associated with a length variable having a value m and a Hamming weight variable having a value l to produce a computed parameter associated with the length variable having a value m−1 and to assign a value to a bit of a codeword X based on a comparison of the computed parameter and a value determined from a data value D to be encoded as the codeword X, wherein the encoding module represents the known parameter using a precision that is insufficient for exact representation of a total number N(n,k) of n-bit codewords having the Hamming weight k,
wherein the encoding module is to store the codeword-encoded data value within a cross-point array of the memory, the data value being encoded as the codeword causing storage of a fixed number of ones or zeros in rows or columns of an encoded memory block including the data value.

9. The device of claim 8, wherein the codeword X has the length n and the Hamming weight k.

10. The device of claim 8, wherein the parameter corresponding to the length value n and the Hamming weight value k is stored in the memory before the device receives the data value D to be encoded.

11. The device of claim 8, further comprising:
a decoding module to apply one or more recursive relations to a known parameter associated with the length variable having the value m and the Hamming weight variable having the value l to produce the computed parameter associated with the length variable having the value m−1 and to determine whether to use the computed parameter in a calculation of the data value D, wherein the computed parameter corresponds to a bit in the codeword and whether the computed parameter is used depends on a value of the corresponding bit of the codeword.

12. The device of claim 8, wherein the encoding module comprises a process evaluating the recursive relation using floating point arithmetic operations having a fixed precision.

13. A process comprising:
(a.) retrieving from a memory device a codeword of a length n and a Hamming weight k to be decoded into a data value, the memory device storing the codeword within a cross-point array of the memory device, the data value being encoded as the codeword causing storage of a fixed number of ones or zeros in rows or columns of an encoded memory block including the data value;
(b.) operating a processing system to apply one or more recursive relations to a known parameter associated with a length m and a Hamming weight l to produce a computed parameter associated with length m−1, wherein the processing system represents the known parameter using a precision that is insufficient for exact representation of a total number N(n,k) of n-bit codewords having the Hamming weight k;
(c.) determining whether to use the computed parameter in a calculation of the data value, wherein the computed parameter corresponds to a bit in the codeword and whether the computed parameter is used depends on a value of the corresponding bit of the codeword;
(d.) reducing the length m by one and setting the known parameter equal to the computed parameter; and
(e.) repeating (b.), (c.), and (d.) until repetition of (c.) have made determinations for all of the bits in the code.

14. The process of claim 13, wherein whether the computed parameter is used in the calculation depends on whether a bit in the codeword at a position corresponding to a current value of the length m equals 1.

15. A device comprising:
memory storing a parameter corresponding to a length value n and a Hamming weight value k; and
a decoding module to apply one or more recursive relations to a known parameter associated with a length variable having a value m and a Hamming weight variable having a value l to produce the computed parameter associated with the length variable having a value m−1 and to determine whether to use the computed parameter in a calculation of a data value decoded from a codeword, wherein the computed parameter corresponds to a bit in the codeword and whether the computed parameter is used depends on a value of the corresponding bit of the codeword,
wherein a cross-point array of the memory stores the codeword-encoded data value, the data value being encoded as the codeword causing storage of a fixed number of ones or zeros in rows or columns of an encoded memory block including the data value.

16. The process of claim 1, wherein storage of the constant Hamming weight codeword-encoded data value within the cross-point array of the memory device maintains consistent memory performance of the memory device.

17. The process of claim 1, wherein storage of the constant Hamming weight codeword-encoded data value within the cross-point array of the memory device decreases data-dependent memory performance issues within the memory device.

18. The process of claim 1, wherein the memory device is a memristor memory device,
and wherein storage of the constant Hamming weight codeword-encoded data value within the cross-point array of the memory device limits numbers of low resistance states of the rows or the columns.

* * * * *